US008994466B2

(12) United States Patent
Filipovic et al.

(10) Patent No.: US 8,994,466 B2
(45) Date of Patent: Mar. 31, 2015

(54) METHODS FOR ADDRESSING AGING OF XO CRYSTALS (71) Applicant: QUALCOMM Incorporated, San Diego, CA (US)

(72) Inventors: Daniel Fred Filipovic, Solana Beach, CA (US); Sasidhar Movva, Boulder, CO (US); Vishal Agarwal, San Diego, CA (US); Dominic Gerard Farmer, Los Gatos, CA (US); Sridhar Bandaru, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 93 days.

(21) Appl. No.: 13/829,603

(22) Filed: Mar. 14, 2013

(65) Prior Publication Data
US 2014/0028403 A1    Jan. 30, 2014

Related U.S. Application Data (60) Provisional application No. 61/676,863, filed on Jul. 27, 2012.

(51) Int. Cl.
*H03B 5/32* (2006.01)
*H03L 7/00* (2006.01)
*H03L 1/00* (2006.01)
*H03L 1/02* (2006.01)

(52) U.S. Cl.
CPC .. *H03L 7/00* (2013.01); *H03L 1/00* (2013.01); *H03L 1/026* (2013.01)
USPC ................ 331/158; 331/116 R; 331/116 FE; 331/176

(58) Field of Classification Search
CPC ............ H03L 1/026; H03L 1/022; H03L 1/00; H03L 1/02; H03L 7/099; H03L 1/027; H03L 7/00; H03L 7/22
USPC ...... 342/357.62; 702/75; 331/116 R, 116 FE, 331/158, 176, 74, 44
See application file for complete search history.

(56) References Cited

U.S. PATENT DOCUMENTS

| 4,922,212 A | 5/1990 | Roberts et al. |
| 5,392,005 A | 2/1995 | Bortolini et al. |
| 7,551,911 B2 | 6/2009 | Shohara et al. |
| 7,688,151 B2 | 3/2010 | Lee |
| 8,159,392 B2 | 4/2012 | Jin et al. |
| 2011/0298548 A1 | 12/2011 | Jackson |
| 2012/0245883 A1 | 9/2012 | Ben-El et al. |

FOREIGN PATENT DOCUMENTS

EP    2081297 A2    7/2009

OTHER PUBLICATIONS

International Search Report and Written Opinion-13 PCT/US2013/051309—ISA/EPO—Oct. 16, 2013.

*Primary Examiner* — Arnold Kinkead
(74) *Attorney, Agent, or Firm* — Kilpatrick Townsend & Stockton LLP (57) ABSTRACT Methods, apparatuses, systems and computer-readable media for addressing the aging of oscillation (XO) crystals are presented. Some embodiments may determine a change of age of the XO crystal since last prior use of the XO crystal. Embodiments may then determine that at least one calibration parameter is not suitable for use in at least one calibration technique of the XO crystal, based on the change of age of the XO crystal. Embodiments may then determine at least one fresh calibration parameter configured to update the at least one calibration parameter for suitable use in the at least one calibration technique of the XO crystal.

32 Claims, 8 Drawing Sheets

METHODS FOR ADDRESSING AGING OF XO CRYSTALS

CROSS REFERENCE TO RELATED APPLICATIONS

This application claims the benefit of U.S. Provisional Patent Application No. 61/676,863, filed Jul. 27, 2012, and titled "METHOD FOR ADDRESSING AGING OF XO CRYSTALS," the disclosure of which is hereby incorporated herein by reference in its entirety and for all purposes.

BACKGROUND

Crystal oscillators, or XO crystals, may be used in many electronic devices to assist with timing information and other processes relying on a steady frequency. Many kinds of XO crystals have been used in electronic devices, where different calibration methods may be used to compensate for variable changes in the XO crystal readings based on various environmental conditions, including temperature and voltage. XO crystals may also vary in performance or frequency based on their age. While some techniques may exist to compensate for some of the variable changes in XO crystals, it may be desirable to implement improved techniques that more efficiently account for more variables.

SUMMARY

These problems and others may be solved according to embodiments of the present invention, described herein.

Methods, apparatuses, systems and computer-readable media for addressing the aging of oscillation (XO) crystals are presented. Some embodiments may determine a change of age of the XO crystal since last prior use of the XO crystal. Embodiments may then determine that at least one calibration parameter is not suitable for use in at least one calibration technique of the XO crystal, based on the change of age of the XO crystal. Embodiments may then determine at least one fresh calibration parameter configured to update the at least one calibration parameter for suitable use in the at least one calibration technique of the XO crystal.

In some embodiments, a method may determine determining a change of age of the XO crystal since last prior use of the XO crystal. The method may then determine that at least one calibration parameter is not suitable for use in at least one calibration technique of the XO crystal, based on the change of age of the XO crystal. The method may then determine at least one fresh calibration parameter configured to update the at least one calibration parameter for suitable use in the at least one calibration technique of the XO crystal. The at least one calibration parameter may be used for an entire range of frequency response calibration values in the at least one calibration technique.

In some embodiments, a method may also expand a search window of the at least one calibration technique. A Recent Good System (RGS) value may then be obtained using the expanded search window. In some embodiments, the at least one fresh calibration parameter may be determined based on the at least one RGS value.

In some embodiments, determining that the at least one calibration parameter is not suitable for use in the at least one calibration technique may be based on at least one quality metric value. In some embodiments, the at least one quality metric value may be a standard deviation in the frequency error of the XO crystal at a given temperature.

In some embodiments, a method may also determine whether a field calibration parameter is older than a threshold age, which may then be used to determine the at least one fresh calibration parameter. In some embodiments, a method may also determine whether a wireless wide area network (WWAN) calibration parameter is older than a threshold age. In some embodiments, a method may also determine whether a global positioning system (GPS) calibration parameter is older than a threshold age. These determinations may be used to determine the at least one fresh calibration parameter. In some embodiments, determining the at least one fresh calibration parameter may be based further on a calibration curve equation.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The term "XO crystal" or "XO oscillator crystal" may refer to a quartz oscillator crystal mechanically treated and refined to aide in timing measurements of an electronic device. These terms may include different types of crystals, including temperature-compensated (TC) XO crystals, voltage-controlled temperature compensated (VCTC) XO crystals, oven-controlled (OC) XO crystals, etc.

Embodiments may account for frequency errors in XO oscillator crystals due to crystal aging. Electronic timing circuits and systems may rely on the mechanical resonance of a vibrating XO crystal to create an electronic signal with a precise resonance frequency. Such timings may be used to keep accurate time, useful in a number of practical applications, including standard time keeping, global positioning techniques and wide area networking (WANs) to name a few examples.

However, due to the physical nature of XO crystals and the need for precise measurements, even small changes in the XO crystal structure may create inaccurate timing measurements without proper adjustments or compensation. For example, one common variation in some XO crystals is temperature change. The readings based on some XO crystals may be dependent in a predictable way based on the temperature of the crystal, which may change due to external environment conditions but also due to heat radiated from a nearby processor in the device using the XO crystal (e.g., mobile device, tablet, personal computer, etc.).

To compensate for at least some of these changes, calibration tables and/or curves may be constructed to offset XO crystal variations. For example, in some cases a frequency temperature (FT) function f(t) may be generated and used to model and/or compensate how the XO crystal changes as a function of temperature. In these cases, the FT function f(t) may be stored in memory, and the outputs from the XO crystal may be adjusted according to a nearby temperature sensor and the f(t) curve.

To improve robustness, in-device field calibration may be performed regularly in order to update calibration values as needed. Field calibration techniques may be useful to adjust XO crystal calibration values when the device is continually in use, for it is expected that the calibration values may change only minimally across a short time span.

Another cause of changing XO crystal readings may be due to the aging of the crystal itself. The physical structure of the crystal may inevitably change over time, and the changes may be unpredictable. If a device using the XO crystal has not been used for a sufficiently long time, e.g. 6 months or a year or more, changes may be substantial, e.g. 1 part per million (ppm) or more. To adjust for crystal aging, sometimes performing field calibration may be sufficient. However, in other cases, field calibration may not be sufficient because the device has not been used for a long time, and thus field calibration may be incapable of accurately measuring the change in calibration values of the XO crystal as the change may be too large. For example, a tablet device that only occasionally utilizes its XO crystal, e.g. using GPS positioning only during vacations overseas taken every couple of years, may need a more precise and robust calibration technique to account for the crystal's age since the last time it was used. Thus, it may be desirable to develop techniques for adjusting for a crystal's age in circumstances like these and others.

Embodiments may use a multi-step approach that first checks whether crystal calibrations may need to be updated, and then update at least one calibration parameter according to various techniques. Some embodiments employ a two-step approach to calculating the XO crystal age offset, including expanding a search window momentarily to create a Recent Good System (RGS) reading, and then performing an update to a calibration coefficient, sometimes called a "$C_0$ Fresh" update. Expanding a search window may allow the device to search over a larger frequency space to account for some of the uncertainty associated with the frequency error introduced by aging. Searching over a larger space increases the likelihood of acquiring and knowing the exact frequency of the XO crystal. Other embodiments may perform calibration updates in other ways, such as updating one or more matrix values of a calibration matrix.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Time Division Synchronous Code Division Multiple Access (TD-SCDMA), Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An FDMA network may include Universal Mobile Telecommunications System—frequency-division duplexing (UMTS-FDD) and the like. An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). These various radio technologies and standards are known in the art.

Single carrier frequency division multiple access (SC-FDMA), which utilizes single carrier modulation and frequency domain equalization is a technique. SC-FDMA has similar performance and essentially the same overall complexity as those of OFDMA system. SC-FDMA signal has lower peak-to-average power ratio (PAPR) because of its inherent single carrier structure. SC-FDMA has drawn great attention, especially in the uplink communications where lower PAPR greatly benefits the mobile terminal in terms of transmit power efficiency. It is currently a working assumption for uplink multiple access scheme in 3GPP Long Term Evolution (LTE), or Evolved UTRA.

Various embodiments are described herein in connection with an access terminal. An access terminal can also be called a system, subscriber unit, subscriber station, mobile station, mobile, remote station, remote terminal, mobile device, user terminal, terminal, wireless communication device, user agent, user device, or user equipment (UE). An access terminal can be a cellular telephone, a cordless telephone, a Session Initiation Protocol (SIP) phone, a wireless local loop (WLL) station, a personal digital assistant (PDA), a handheld device having wireless connection capability, computing device, or other processing device connected to a wireless modem. Moreover, various embodiments are described herein in connection with a base station. A base station can be utilized for communicating with access terminal(s) and can also be referred to as an access point, Node B, Evolved Node B (eNodeB), access point base station, or some other terminology.

Figure 1:
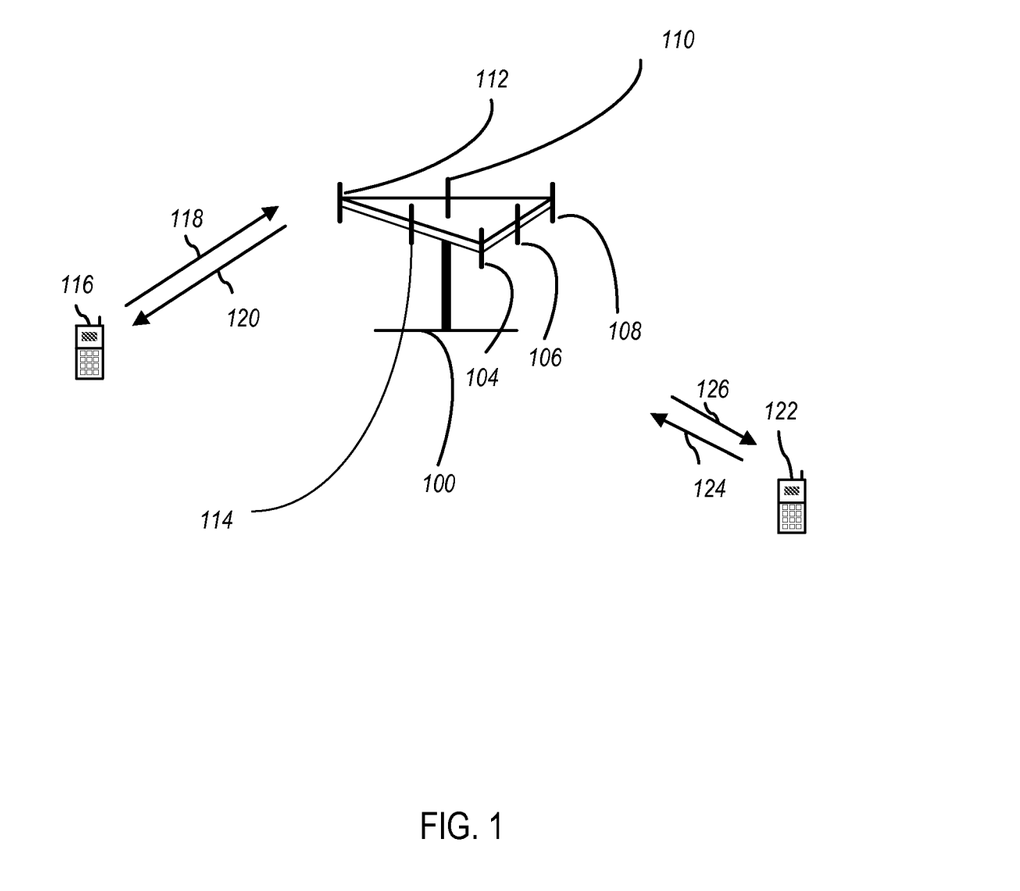
FIG. 1 is an example multiple access wireless communication system according to some embodiments.

Referring to FIG. 1, a multiple access wireless communication system according to some embodiments is illustrated. An access point (AP) 100 includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) is in communication with AP 100 via antennas 112 and 114, where antennas 112 and 114 transmit signals to access terminal 116 over forward link 120 and receive signals from access terminal 116 over reverse link 118. Access terminal 122 is in communication with AP 100 via antennas 106 and 108, where antennas 106 and 108 transmit signals to access terminal 122 over forward link 126 and receive signals from access terminal 122 over reverse link 124. In a Frequency Division Duplex (FDD) system, communication links 118, 120, 124 and 126 may use different frequencies for communication. For example, forward link 120 may use a different frequency then that used by reverse link 118.

Each group of antennas and/or the area in which they are designed to communicate is often referred to as a sector of the access point. In some embodiments, antenna groups each are designed to communicate to access terminals in a sector of the areas covered by access point 100.

In communication over forward links 120 and 126, the transmitting antennas of access point 100 utilize beamforming in order to improve the signal-to-noise ratio of forward links for the different access terminals 116 and 124. Also, an access point using beamforming to transmit to access terminals scattered randomly through its coverage causes less interference to access terminals in neighboring cells than an access point transmitting through a single antenna to all its access terminals.

Figure 2:
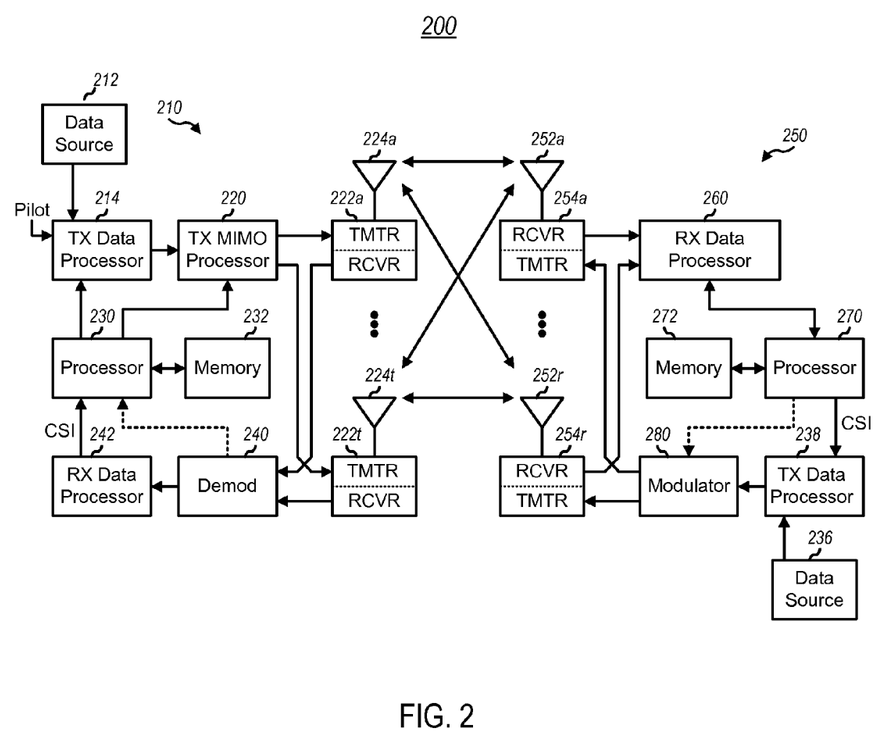
FIG. 2 is an example wireless communications interface including a transmitter system and a receiver system according to some embodiments.

FIG. 2 is a block diagram of an embodiment of a transmitter system 210 of an access point and a receiver system 250 of an access terminal in a multiple-input and multiple-output (MIMO) system 200. At the transmitter system 210, traffic data for a number of data streams is provided from a data source 212 to a transmit (TX) data processor 214.

In some embodiments, each data stream is transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides NT modulation symbol streams to NT transmitters (TMTR) 222a through 222t, where NT is a positive integer associated with transmitters described in FIG. 2. In certain embodiments, TX MIMO processor 220 applies beamforming weights to the symbols of the data streams and to the antenna from which the symbol is being transmitted. TX MIMO processor 220 may contain one or more XO crystals used to aide in timing measurements.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals are received by NR antennas 252a through 252r and the received signal from each antenna 252 is provided to a respective receiver (RCVR) 254a through 254r, where NR is a positive integer associated with receivers described in FIG. 2. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the NR received symbol streams from NR receivers 254 based on a particular receiver processing technique to provide NT "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at transmitter system 210. RX data processor 260 may contain one or more XO crystals used to aide in timing measurements.

A processor 270 periodically determines which pre-coding matrix to use (discussed below). Processor 270 formulates a reverse link message comprising a matrix index portion and a rank value portion. Processor 270 may contain one or more XO crystals used to obtain timing measurements for formulating the link message. Memory 272 stores the various pre-coding matrices that are used by processor 270.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights then processes the extracted message. Processor 230 obtains the pre-coding matrices from memory 232, which stores various pre-coding matrices. Processor 230 may contain one or more XO crystals used to obtain timing measurements for performing any of these functions. Memory 232 may also contain other types of data, such as information databases and locally and globally unique attributes of multiple base stations.

Figure 3A:
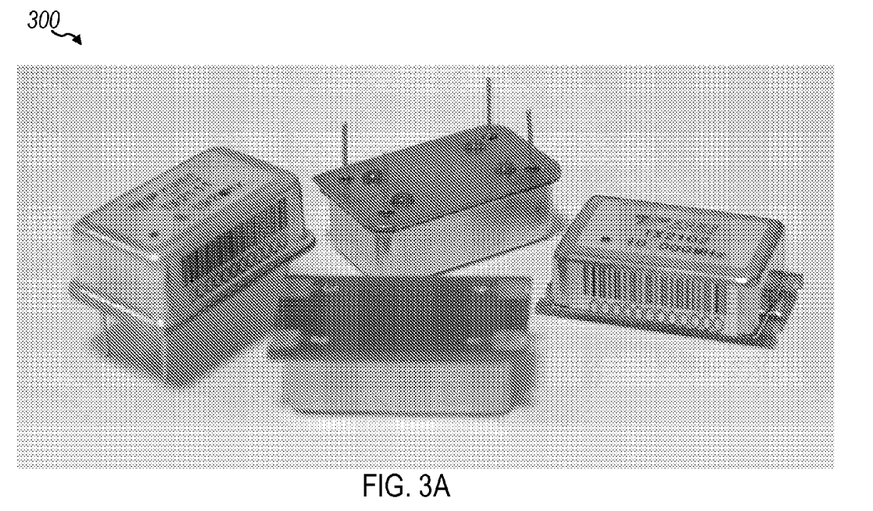
FIG. 3A is an illustration showing example XO crystals used in some embodiments.

Referring to FIG. 3A, embodiments may relate to timing oscillators like some of the examples shown in illustration 300. As shown, housed in each metal box may be an oscillator crystal, or XO crystal, that may help regulate timing measurements when an electric current is run through the crystal. The XO crystal may be a simple quartz crystal with no treatment done to it, or may be a quartz crystal which is synthetically, mechanically, and/or electronically treated to improve its timing capabilities. The resulting crystal may be, for example, a TCVCXO (temperature-compensated voltage-controlled crystal oscillator), OVXO (Oven-controlled crystal oscillator), VCXO (voltage-controlled crystal oscillator) and many others known in the art. These components as shown in illustration 300 may be installed in electronic circuit boards, like a processor motherboard, or any of the processors described in FIG. 2 or others in the disclosure herein. The illustration 300 provides just a few examples for what oscillator crystals may look like. There are many other variations which are known in the art.

Figure 3B:
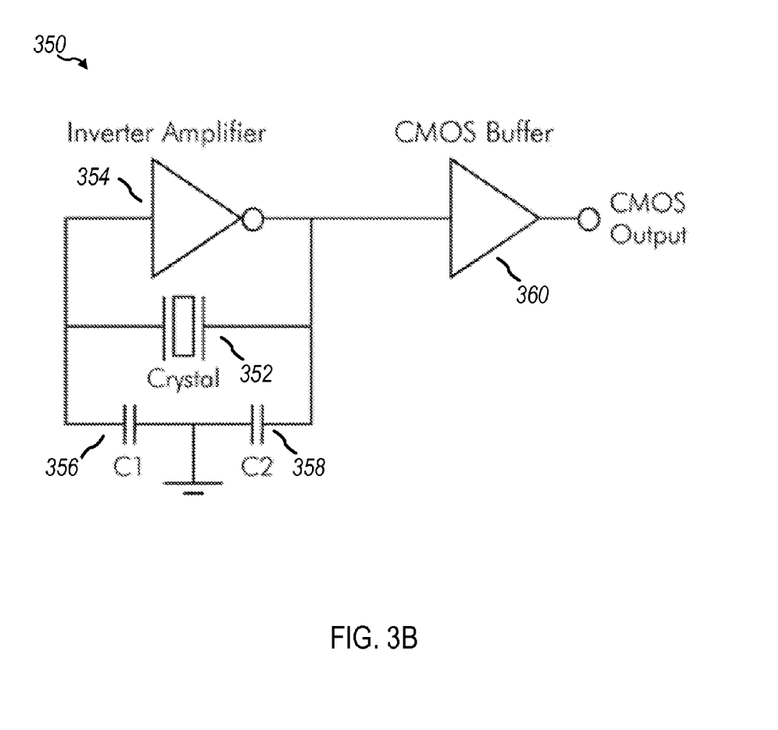
FIG. 3B is an example circuit diagram demonstrating how an XO crystal may be used.

Referring to FIG. 3B, schematic 350 may illustrate an example circuit diagram of how an XO crystal 352 is connected in a logic circuit. Inverter Amplifier 354 may provide a feedback signal through XO crystal 352 and capacitors C1 356 and C2 358. The feedback loop as shown amplifies the resonance frequency of the XO crystal, and other frequencies may be filtered out by the CMOS buffer 360 or some other filter. The resulting output is the resonance frequency of the XO crystal. FIG. 3B represents just one example of how an XO crystal may operate. There are many other examples possible and known in the art, and embodiments are not so limited.

XO crystals may be sensitive to surrounding environmental changes, such as heat created by a processor or changes in temperature of ambient conditions (e.g. day turns to night, starts to snow, etc.). Some XO crystals may have a resonance frequency dependent on some of these changes, and thus some XO crystals may need accompanying calibration curves, matrices, and/or methods to offset the frequency errors caused by such environmental changes.

Figure 4A:
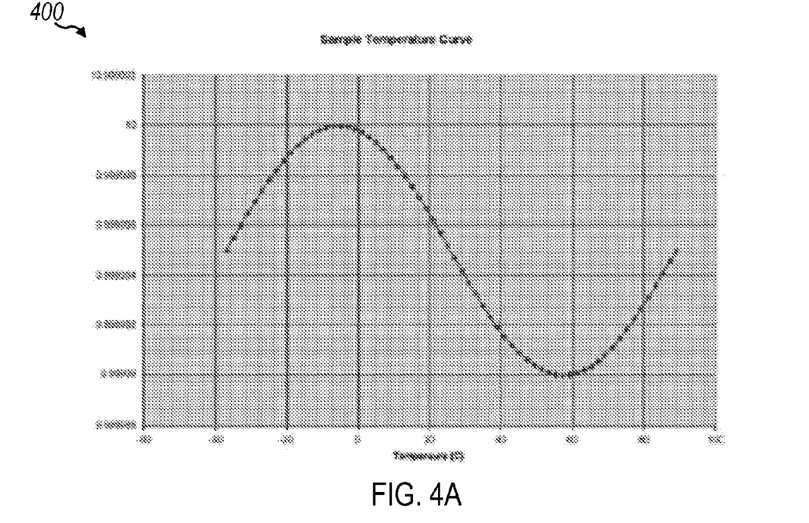
FIG. 4A shows an example Frequency Temperature (FT) calibration curve according to some embodiments.

Referring to FIG. 4A, graph 400 shows an exemplary Frequency Temperature (FT) curve f(t) used to offset frequency changes in an XO crystal caused by changing temperatures. As shown, an FT curve may be represented as a cubic function having the form:

$$f(t)=C_3(t-t_0)^3+C_2(t-t_0)^2+C_1(t-t_0)+C_0 \qquad (1),$$

where $C_i$ is a calibration constant for each $i=0 \ldots 3$, $t_0$ is a temperature center point, often times around ambient temperature or 29-31 degrees Celsius, and t is temperature, the independent variable. Thus, for a temperature value t, the calibration frequency temperature offset f(t) is computed according to calibration constants $\{C_0, C_1, C_2, C_3\}$. These calibration constants may be preconfigured upon manufacture of a device carrying the XO crystal in the factory. While in use, field calibration functions in the device itself may continually update these calibration constants. These calibration constants may be stored in tables, in a matrix of values or other suitable means.

The FT curve in graph 400 may be simply just one example of how calibrations for XO crystal frequency errors are computed and expressed. Other crystals may not need or rely on functional curves. For example, calibrations may be stored as a series of values in a matrix, with no discernible pattern connecting the values such as a cubic function relating temperature to frequency temperature offset. Other types of calibrations are also possible and may be known in the art.

Figure 4B:
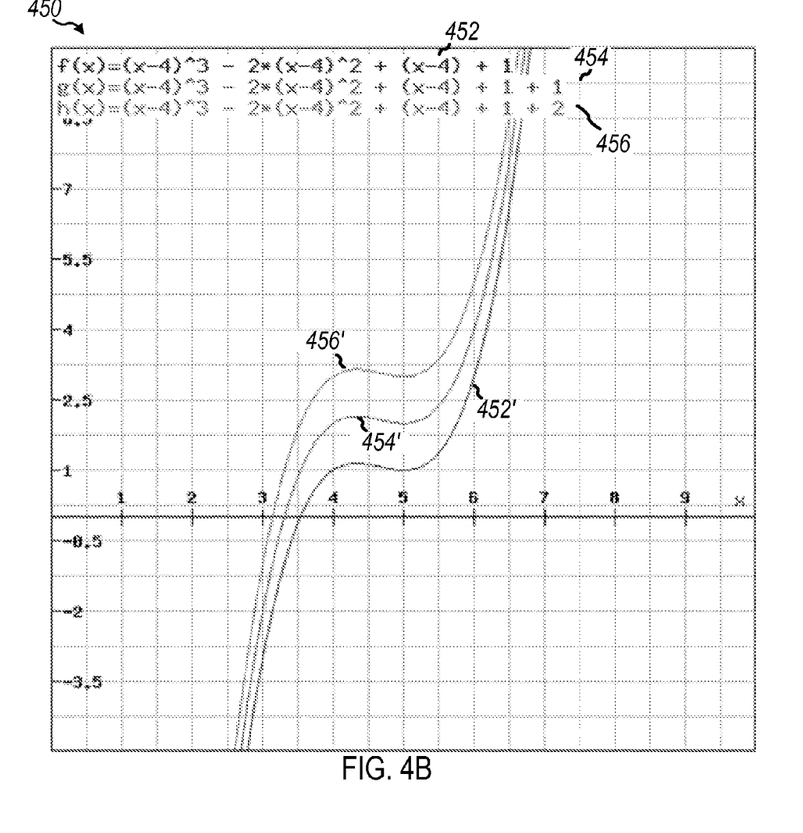
FIG. 4B shows example FT curves according to some embodiments.

Referring to FIG. 4B, exemplary graph 450 may illustrate an additional change in frequency errors of an XO crystal due to aging of the crystal. An XO crystal that ages may gradually shift the FT curve by a linear amount, i.e. the $C_0$ constant may increase or decrease. Graph 450 with example equations 452, 454, and 456 illustrate the effects of a curve shift due to possible crystal aging. One may be able to see the difference in equations 452, 454 and 456 is an addition of 1 each, according to the equations as shown. The corresponding curves 452', 454', and 456' respectively are the graphical effects of adding 1 to each successive curve, for illustrative purposes. It should be apparent, therefore, that crystal aging may be significant in leading to erroneous frequency error offsets if not fully corrected.

At least some calibrations may not successfully account for the full effects of crystal aging. For example, field calibration techniques may not be sufficient for correcting large errors due to aging when an XO crystal has not been used after a long time. For example, if an XO crystal has not been utilized for two years, then the frequency error caused by the two-year-aged crystal may render the two-year old calibration values inaccurate, and field calibration may not sufficiently correct for these errors.

Embodiments may correct for the effects of crystal aging using a multi-tiered approach. Embodiments may first keep track of a time stamp of the last time the XO crystal was used. The time stamp may be used to keep track of the time, and thus the age, of the XO crystal. Embodiments may then determine if the calibration constant $C_0$ is recent enough to be used in calibration.

Figure 5:
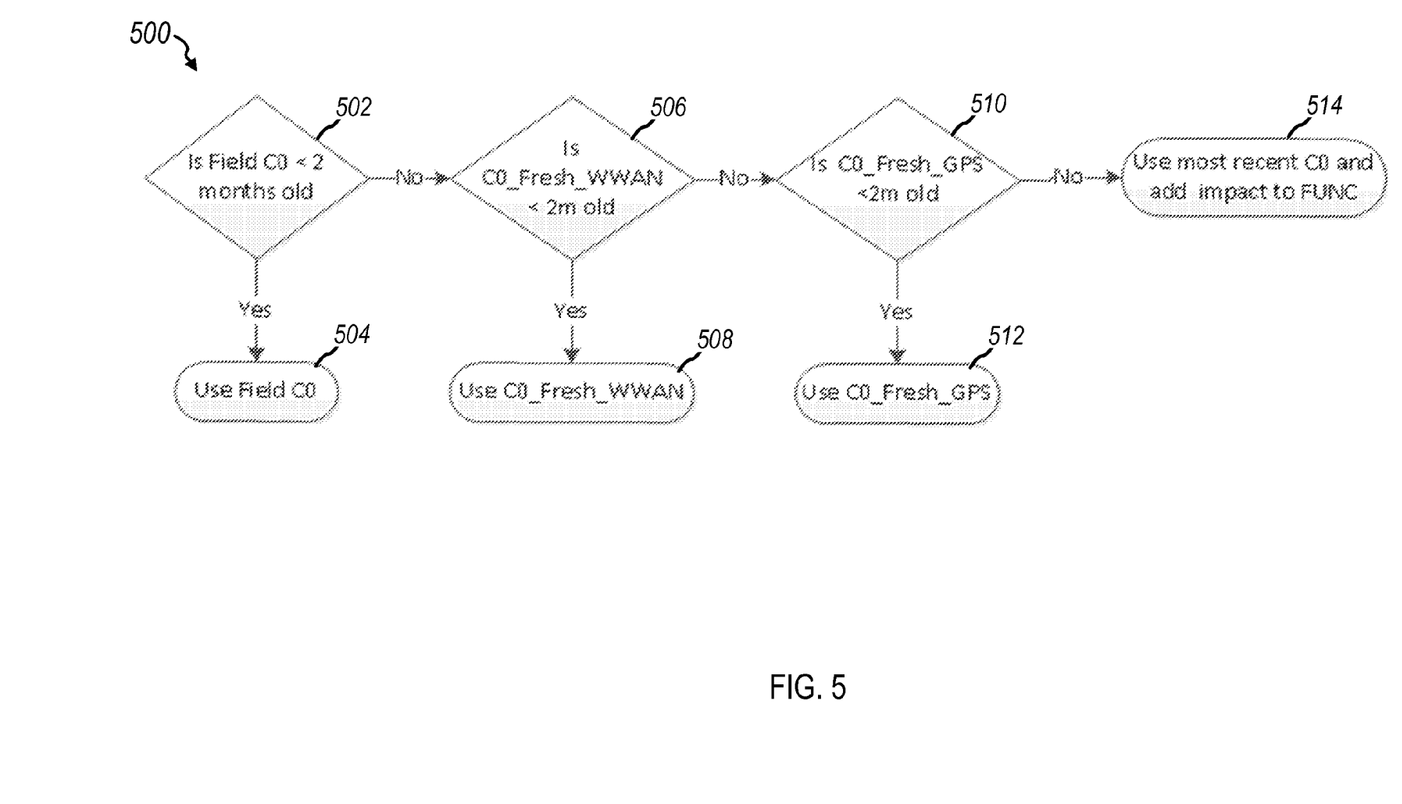
FIG. 5 is an example flowchart according to some embodiments.

Referring to FIG. 5, embodiments may determine whether one of a series of calibration constants can be used as $C_0$ in the FT curve previously mentioned. These determinations may be based at least in part on measuring the age of the constants. If the calibration values are too old, then the constants may be deemed too inaccurate and new constants may need to be generated according to other techniques of some embodiments.

In chart 500 for example, at decision block 502, embodiments may first determine whether a Field $C_0$ is more recent than a threshold age, for example 2 months. Determining such an age of the constant may be dependent on keeping track of a time stamp as previously mentioned. In this case, if the Field $C_0$ constant is less than 2 months old, then at block 504 the Field $C_0$ may be used as the constant $C_0$ in the FT curve for calibration.

If the Field $C_0$ constant is older, then at block 506, another constant, for example $C_0$Fresh_WWAN, may similarly be determined if it is more recent than a threshold age, for example 2 months. If so, then at block 508 this constant may be used in the FT curve. If not, then embodiments may make yet another determination, for example at block 510, whether a constant $C_0$_Fresh_GPS may be more recent in age than 2 months. If so, then at block 512 the $C_0$Fresh_GPS constant may be used in the FT curve. If none of the available constants satisfy thresholds that signify a sufficiently recent value, then at block 514, the most recent $C_0$ constant may be used as the best alternative. As the names suggest, these constants exemplified in chart 500 may represent constants used in different functions, such as in field calibration, wireless wide area network (WWAN) calculations, or global positioning system (GPS) techniques. Each of these functions may utilize the XO crystal, and may thus have different calibration constants. In some embodiments, these constants are all the same, and thus some embodiments may utilize a flowchart that is abbreviated than the one described in chart 500.

In other embodiments, the threshold age of the constants may be different than 2 months. The threshold age may be 3 months, 6 months, or 1 year, for example. Embodiments are not so limited.

In some embodiments, if none of these $C_0$ constants are usable according to the threshold age previously mentioned, then embodiments may generate a new $C_0$ offset, sometimes called a $C_0$_Fresh constant, not shown. An example calculation for a $C_0$_Fresh constant is explained below.

Figure 6:
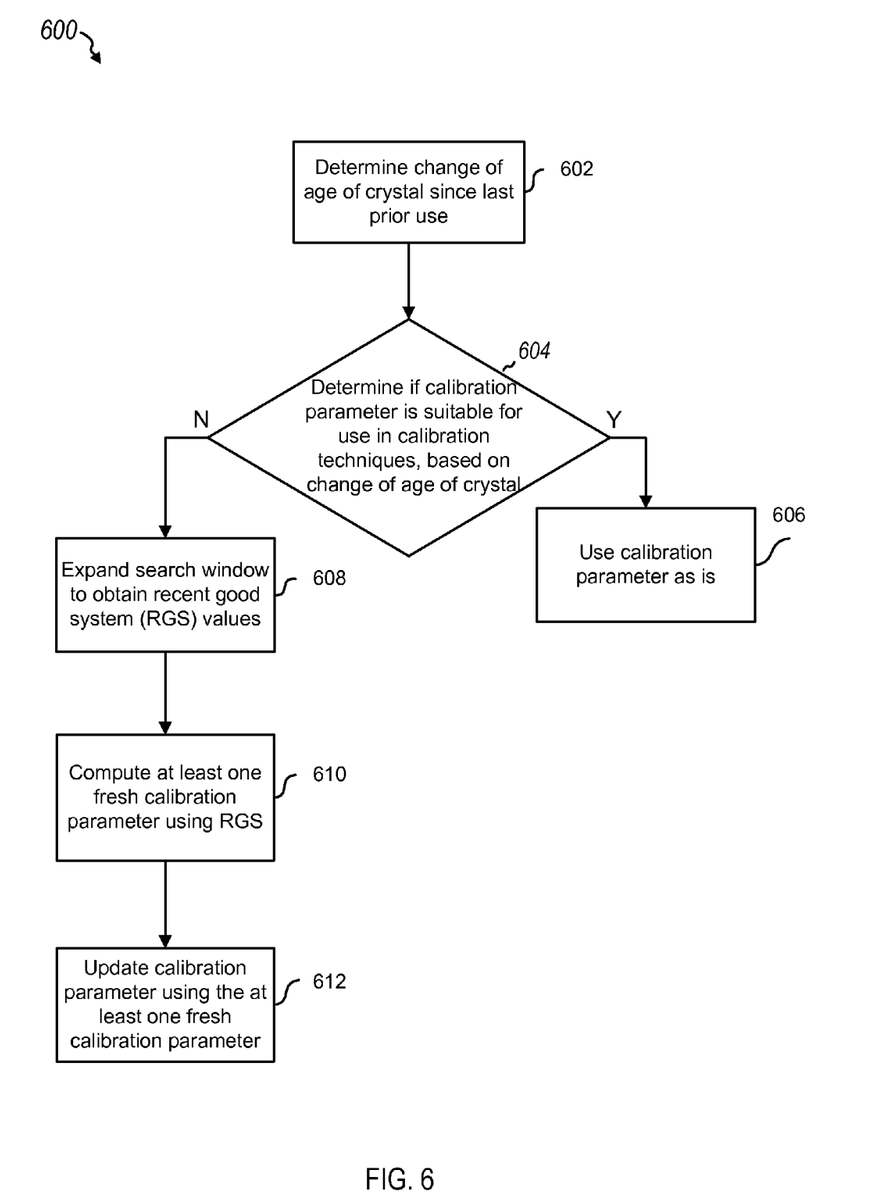
FIG. 6 is an exemplary flowchart showing methods of some embodiments.

Referring to FIG. 6, flowchart 600 may show an exemplary method for adjusting for the age of XO crystals according to some embodiments. Starting at block 602, embodiments may determine a change of age of an XO crystal since its last prior use. Embodiments may keep track of and record a time stamp since last use to be able to calculate the change in age. For example, the XO crystal of a tablet may not have been used for 12 months since the time in between vacations.

At block 604, embodiments may determine if one or more calibration parameters are suitable for use in XO crystal calibration techniques, based on the age of the crystal. These calibration parameters may include calibration constants in FT curves used to calibrate TCXO crystals, or matrix values of calibration tables used to calibrate other types of XO crystals. Determinations at block 604 may be based on the checks described in FIG. 5. Other determinations may be made, with varying threshold values used to determine whether the change in the age of the XO crystal is too large or not.

In other cases, embodiments may also rely on at least one quality metric value to determine whether the calibration parameters are suitable for use. In cases where a simple threshold value for determining is not nuanced enough, embodiments may evaluate each calibration parameter according to the at least one quality metric value. Examples of quality metric values may be a standard deviation in the frequency error of the XO crystal at a given temperature. Thus, depending on the determinations made using the quality metric values, one or more calibration parameters may need to be adjusted.

At block 606, if it is determined that the calibration parameters are still suitable, e.g. the XO crystal has not aged too significantly, then embodiments may use the calibration constants as is. For example, embodiments may use the calibration parameters with field calibration techniques as the only methods for calibrating the XO crystal.

However, if it is determined that the calibration parameters are not suitable based on the change of age of the XO crystal, then at block 608, embodiments may conduct techniques to address the change of age of the XO crystal. Embodiments may expand a search window to obtain at least one recent good system (RGS) value. A search window as described herein may refer to the range of a calibration variable to be searched when performing field calibration. For example, in TCXO crystals that vary based on the surrounding temperature of the crystal, field calibration may determine calibration constants for an FT curve of the XO crystal by searching for the right calibration constant within a specified temperature range, i.e. the search window. Expanding a search window may allow the device to search over a larger frequency space to account for some of the uncertainty associated with the frequency error introduced by aging. Searching over a larger space increases the likelihood of acquiring and knowing the exact frequency of the XO crystal. In some cases however, it is desirable for the size of the search window to be reduced, because conducting field calibration with larger search windows consumes more power and takes longer. An RGS may refer to at least one or a set of calibration parameters that was last known to properly calibrate the XO crystal. The values for an RGS may be stored in a table or a database, for example. The RGS may be, for example, all resulting values from an FT curve across temperature ranges from 0 degrees Celsius to 70 degrees Celsius used to calibrate readings from the XO crystal at those temperatures.

In the case where the XO crystal has aged significantly such that current calibration parameters are no longer suitable, the size of the search window normally may be insufficient for finding suitable calibration parameters. Thus, embodiments may expand the search window temporarily in order to find the suitable calibration parameters. Embodiments may expand the search window briefly, for more power and time is spent the larger the search window is.

Referring to block 610, having obtained RGS values using an expanded search window from block 608, embodiments may compute at least one fresh calibration parameter using the RGS values. A fresh calibration parameter may be referred to as "$C_0$Fresh" in some cases. Some embodiments may compute a fresh calibration parameter according to the following equation:

$$C_0\_Fresh = RGS - FT\ curve\ estimate + C_0 \qquad (2),$$

where $C_0\_Fresh$ is a fresh calibration parameter updated to account for the change of age of an XO crystal, RGS is the values of the recent good system using the expanded search window, FT curve estimate is a frequency temperature curve consistent with what is described in FIGS. 4A and 4B, and $C_0$ is the constant of the FT curve of 0 order. Other calculations may be used to obtain a fresh calibration parameter, including calculations used for XO crystals that are not dependent on temperature calibrations, and equation (2) is merely an example.

Referring to block 612, embodiments may then use the at least one fresh calibration constant to update the prior set of calibration parameters. Once the calibration parameters have been updated through embodiments described herein to address the aging of the XO crystal, field calibration may be performed under typical conditions.

Figure 7:
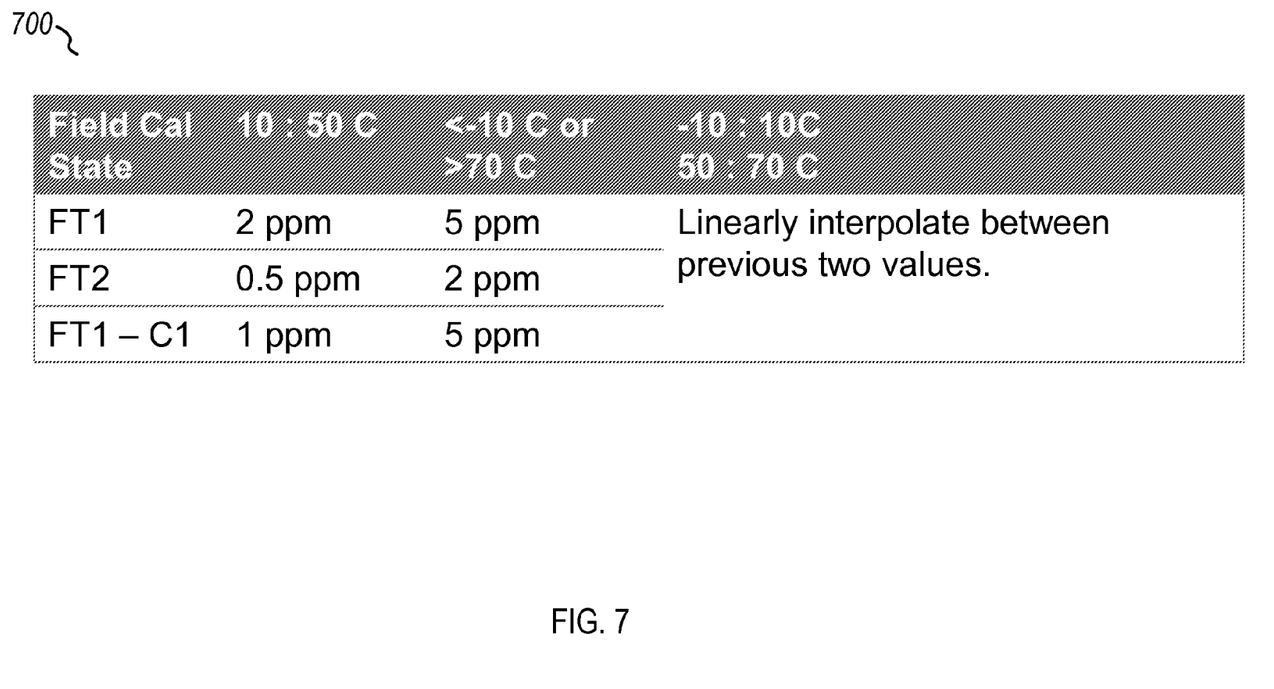
FIG. 7 is an example chart of search window criteria according to some embodiments.

Referring to FIG. 7, chart 700 shows an example set of criteria for determining what size search window should be used under normal conditions. The example search windows may be consistent with the search windows discussed in FIG. 6. Here, the Field Calibration State and the current temperature of XO crystal may determine a normal size of the search window (e.g. in parts per million or ppm) as shown. In the event that the XO crystal has aged significantly, the search window may be expanded beyond these ranges. Such information according to FIG. 7 may be useful in reducing power and time spent in field calibrations in embodiments.

Many embodiments may be made in accordance with specific requirements. For example, customized hardware might also be used, and/or particular elements might be implemented in hardware, software (including portable software, such as applets, etc.), or both. Further, connection to other computing devices such as network input/output devices may be employed.

Figure 8:
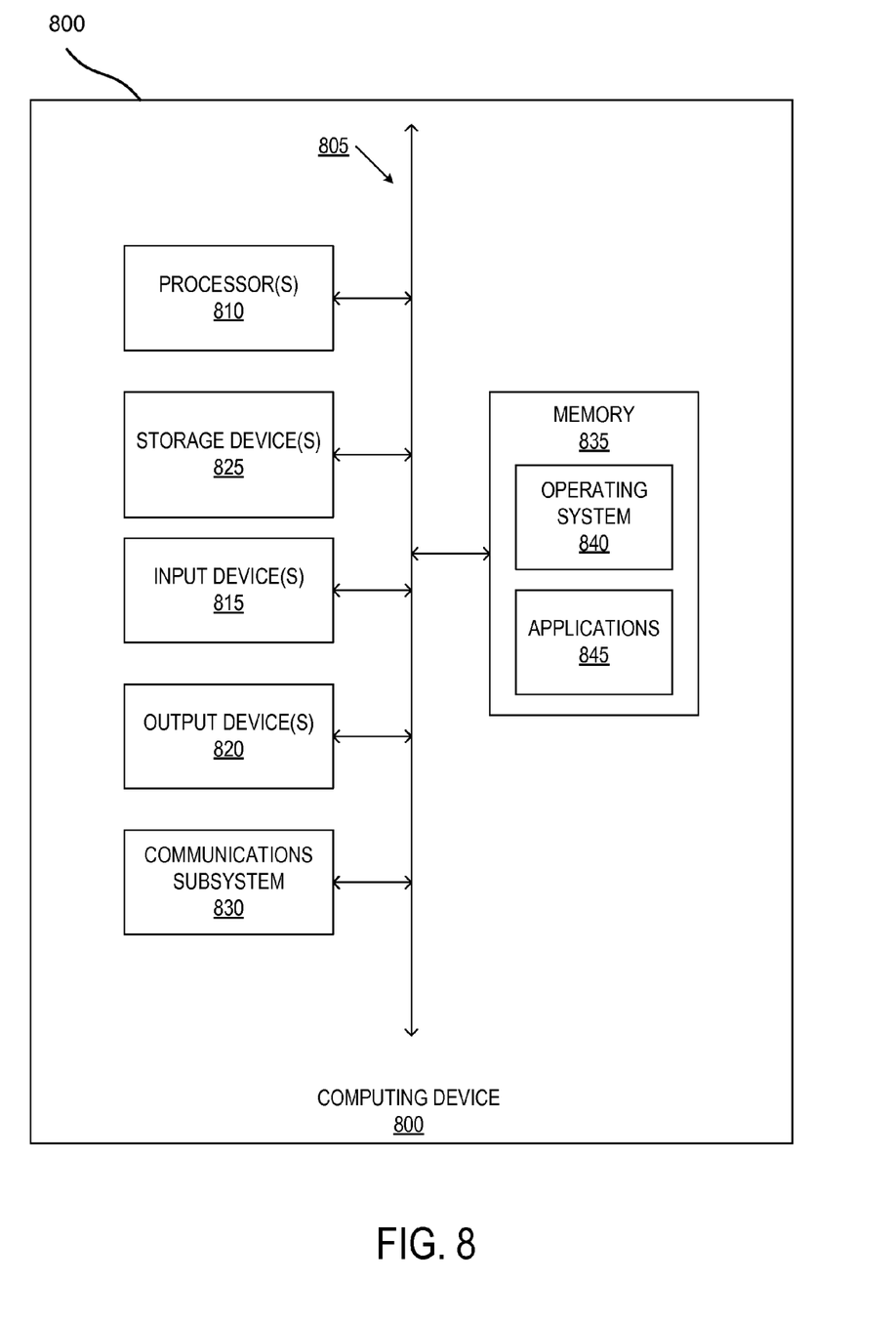
FIG. 8 is an example computer system according to some embodiments.

Having described multiple aspects of addressing the change in age of an XO crystal, an example of a computing system in which various aspects of the disclosure may be implemented will now be described with respect to FIG. 8. According to one or more aspects, a computer system as illustrated in FIG. 8 may be incorporated as part of a computing device, which may implement, perform, and/or execute any and/or all of the features, methods, and/or method steps described herein. For example, computer system 800 may represent some of the components of a hand-held device. A hand-held device may be any computing device with an input sensory unit, such as a wireless receiver or modem. Examples of a hand-held device include but are not limited to video game consoles, tablets, smart phones, televisions, and mobile devices or mobile stations. In some embodiments, the system 800 is configured to implement any of the methods described above. FIG. 8 provides a schematic illustration of one embodiment of a computer system 800 that can perform the methods provided by various other embodiments, as described herein, and/or can function as the host computer system, a remote kiosk/terminal, a point-of-sale device, a mobile device, a set-top box, and/or a computer system. FIG. 8 is meant only to provide a generalized illustration of various components, any and/or all of which may be utilized as appropriate. FIG. 8, therefore, broadly illustrates how individual system elements may be implemented in a relatively separated or relatively more integrated manner.

The computer system 800 is shown comprising hardware elements that can be electrically coupled via a bus 805 (or may otherwise be in communication, as appropriate). The hardware elements may include one or more processors 810, including without limitation one or more general-purpose processors and/or one or more special-purpose processors (such as digital signal processing chips, graphics acceleration processors, and/or the like); one or more input devices 815, which can include without limitation a camera, wireless receivers, wireless sensors, a mouse, a keyboard and/or the like; and one or more output devices 820, which can include without limitation a display unit, a printer and/or the like. In some embodiments, the one or more processor 810 may be configured to perform a subset or all of the functions described above with respect to FIGS. 5 and 6. The processor 810 may comprise a general processor and/or and application processor, for example. In some embodiments, the processor is integrated into an element that processes visual tracking device inputs and wireless sensor inputs.

The computer system 800 may further include (and/or be in communication with) one or more non-transitory storage devices 825, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 800 might also include a communications subsystem 830, which can include without limitation a modem, a network card (wireless or wired), an infrared communication device, a wireless communication device and/or chipset (such as a Bluetooth® device, an 802.11 device, a WiFi device, a WiMax device, cellular communication facilities, etc.), and/or the like. The communications subsystem 830 may permit data to be exchanged with a network (such as the network described below, to name one example), other computer systems, and/or any other devices described herein. In many embodiments, the computer system 800 will further comprise a non-transitory working memory 835, which can include a RAM or ROM device, as described above. Embodiments may also include an XO crystal housed in any one of the functional blocks described herein, including processor 810, memory 835, and storage device 825.

The computer system 800 also can comprise software elements, shown as being currently located within the working memory 835, including an operating system 840, device drivers, executable libraries, and/or other code, such as one or more application programs 845, which may comprise computer programs provided by various embodiments, and/or may be designed to implement methods, and/or configure systems, provided by other embodiments, as described herein. Merely by way of example, one or more procedures described with respect to the method(s) discussed above, for example as described with respect to FIGS. 5 and 6, might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 825 described above. In some cases, the storage medium might be incorporated within a computer system, such as computer system 800. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 800 and/or might take the form of source and/or installable code, which, upon compilation and/or installation on the computer system 800 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

Some embodiments may employ a computer system (such as the computer system 800) to perform methods in accordance with the disclosure. For example, some or all of the procedures of the described methods may be performed by the computer system 800 in response to processor 810 executing one or more sequences of one or more instructions (which might be incorporated into the operating system 840 and/or other code, such as an application program 845) contained in the working memory 835. Such instructions may be read into the working memory 835 from another computer-readable medium, such as one or more of the storage device(s) 825. Merely by way of example, execution of the sequences of instructions contained in the working memory 835 might cause the processor(s) 810 to perform one or more procedures of the methods described herein, for example methods described with respect to FIGS. 5 and 6.

The terms "machine-readable medium" and "computer-readable medium," as used herein, refer to any medium that participates in providing data that causes a machine to operate in a specific fashion. In an embodiment implemented using the computer system 800, various computer-readable media might be involved in providing instructions/code to processor(s) 810 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 825. Volatile media include, without limitation, dynamic memory, such as the working memory 835. Transmission media include, without limitation, coaxial cables, copper wire and fiber optics, including the wires that comprise the bus 805, as well as the various components of the communications subsystem 830 (and/or the media by which the communications subsystem 830 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 810 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 800. These signals, which might be in the form of electromagnetic signals, acoustic signals, optical signals and/or the like, are all examples of carrier waves on which instructions can be encoded, in accordance with various embodiments of the invention.

The communications subsystem 830 (and/or components thereof) generally will receive the signals, and the bus 805 then might carry the signals (and/or the data, instructions, etc. carried by the signals) to the working memory 835, from which the processor(s) 810 retrieves and executes the instructions. The instructions received by the working memory 835 may optionally be stored on a non-transitory storage device 825 either before or after execution by the processor(s) 810. Memory 835 may contain at least one database according to any of the databases methods described herein. Memory 835 may thus store any of the values discussed in any of the present disclosures.

The methods described in FIGS. 5 and 6 may be implemented by various blocks in FIG. 8. For example, processor 810 may be configured to perform any of the functions of blocks in diagram 600. Storage device 825 may be configured to store an intermediate result, such as a globally unique attribute or locally unique attribute discussed within any of blocks mentioned herein. Storage device 825 may also contain a database consistent with any of the present disclosures. The memory 835 may similarly be configured to record signals, representation of signals, or database values necessary to perform any of the functions described in any of the blocks mentioned herein. Results that may need to be stored in a temporary or volatile memory, such as RAM, may also be included in memory 835, and may include any intermediate result similar to what may be stored in storage device 825. Input device 815 may be configured to receive wireless signals from satellites and/or base stations according to the present disclosures described herein. Output device 820 may be configured to display images, print text, transmit signals and/or output other data according to any of the present disclosures.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes depicted as flow diagrams or block diagrams. Although each may describe the operations as a sequential process, many of the operations can be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

Various examples have been described. These and other examples are within the scope of the following claims.

What is claimed is:

1. A method for calibrating an XO crystal, the method comprising:
   determining a change of age of the XO crystal since last prior use of the XO crystal;
   determining that at least one calibration parameter is not suitable for use in at least one calibration technique of the XO crystal, based on the change of age of the XO crystal;
   expanding a search window of the at least one calibration technique; and
   determining at least one fresh calibration parameter using the expanded search window, the at least one fresh calibration parameter being configured to update the at least one calibration parameter for suitable use in the at least one calibration technique of the XO crystal, wherein the at least one calibration parameter is used for an entire range of frequency response calibration values in the at least one calibration technique.

2. The method of claim 1, further comprising:
   expanding a search window of the at least one calibration technique; and
   obtaining at least one Recent Good System (RGS) value using the expanded search window.

3. The method of claim 2, wherein determining the at least one fresh calibration parameter is based on the at least one RGS value.

4. The method of claim 1, wherein determining that the at least one calibration parameter is not suitable for use in the at least one calibration technique is based on at least one quality metric value.

5. The method of claim 1, further comprising:
   determining whether a field calibration parameter is older than a threshold age.

6. The method of claim 5, further comprising:
determining whether a wireless wide area network (WWAN) calibration parameter is older than a threshold age.

7. The method of claim 6, further comprising:
determining whether a global positioning system (GPS) calibration parameter is older than a threshold age.

8. The method of claim 1, wherein determining the at least one fresh calibration parameter is based on the following equation:

$$C_0\_Fresh = RGS - FT \text{ curve estimate} + C_0,$$

wherein $C_0\_Fresh$ is the at least one fresh calibration parameter, RGS is a Recent Good System value, FT curve estimate is a calibration curve and $C_0$ is a constant.

9. An apparatus configured to calibrate an XO crystal, the apparatus comprising a processor configured to:
determine a change of age of the XO crystal since last prior use of the XO crystal;
determine that at least one calibration parameter is not suitable for use in at least one calibration technique of the XO crystal, based on the change of age of the XO crystal;
expand a search window of the at least one calibration technique; and
determine at least one fresh calibration parameter using the expanded search window, the at least one fresh calibration parameter being configured to update the at least one calibration parameter for suitable use in the at least one calibration technique of the XO crystal, wherein the at least one calibration parameter is used for an entire range of frequency response calibration values in the at least one calibration technique.

10. The apparatus of claim 9, wherein the processor is further configured to:
expand a search window of the at least one calibration technique; and
obtain at least one Recent Good System (RGS) value using the expanded search window.

11. The apparatus of claim 10, wherein determining the at least one fresh calibration parameter is based on the at least one RGS value.

12. The apparatus of claim 9, wherein determining that the at least one calibration parameter is not suitable for use in the at least one calibration technique is based on at least one quality metric value.

13. The apparatus of claim 9, wherein the processor is further configured to:
determine whether a field calibration parameter is older than a threshold age.

14. The apparatus of claim 13, wherein the processor is further configured to:
determine whether a wireless wide area network (WWAN) calibration parameter is older than a threshold age.

15. The apparatus of claim 14, wherein the processor is further configured to:
determine whether a global positioning system (GPS) calibration parameter is older than a threshold age.

16. The apparatus of claim 9, wherein determining the at least one fresh calibration parameter is based on the following equation:

$$C_0\_Fresh = RGS - FT \text{ curve estimate} + C_0,$$

wherein $C_0\_Fresh$ is the at least one fresh calibration parameter, RGS is a Recent Good System value, FT curve estimate is a calibration curve and $C_0$ is a constant.

17. An apparatus configured to calibrate an XO crystal, the apparatus comprising:
means for determining a change of age of the XO crystal since last prior use of the XO crystal;
means for determining that at least one calibration parameter is not suitable for use in at least one calibration technique of the XO crystal, based on the change of age of the XO crystal;
means for expanding a search window of the at least one calibration technique; and
means for determining at least one fresh calibration parameter using the expanded search window, the at least one fresh calibration parameter being configured to update the at least one calibration parameter for suitable use in the at least one calibration technique of the XO crystal, wherein the at least one calibration parameter is used for an entire range of frequency response calibration values in the at least one calibration technique.

18. The apparatus of claim 17, further comprising:
means for expanding a search window of the at least one calibration technique; and
means for obtaining at least one Recent Good System (RGS) value using the expanded search window.

19. The apparatus of claim 18, wherein means for determining the at least one fresh calibration parameter is based on the at least one RGS value.

20. The apparatus of claim 17, wherein means for determining that the at least one calibration parameter is not suitable for use in the at least one calibration technique is based on at least one quality metric value.

21. The apparatus of claim 17, further comprising:
means for determining whether a field calibration parameter is older than a threshold age.

22. The apparatus of claim 21, further comprising:
means for determining whether a wireless wide area network (WWAN) calibration parameter is older than a threshold age.

23. The apparatus of claim 22, further comprising:
means for determining whether a global positioning system (GPS) calibration parameter is older than a threshold age.

24. The apparatus of claim 17, wherein means for determining the at least one fresh calibration parameter is based on the following equation:

$$C_0\_Fresh = RGS - FT \text{ curve estimate} + C_0,$$

wherein $C_0\_Fresh$ is the at least one fresh calibration parameter, RGS is a Recent Good System value, FT curve estimate is a calibration curve and $C_0$ is a constant.

25. A computer program product residing on a non-transitory processor-readable medium and comprising processor-readable instructions configured to cause a processor to:
determine a change of age of the XO crystal since last prior use of the XO crystal;
determine that at least one calibration parameter is not suitable for use in at least one calibration technique of the XO crystal, based on the change of age of the XO crystal;
expand a search window of the at least one calibration technique; and
determine at least one fresh calibration parameter using the expanded search window, the at least one fresh calibration parameter being configured to update the at least one calibration parameter for suitable use in the at least one calibration technique of the XO crystal, wherein the at least one calibration parameter is used for an entire range of frequency response calibration values in the at least one calibration technique.

26. The computer program product of claim 25, wherein the instructions further cause the processor to:
expand a search window of the at least one calibration technique; and
obtain at least one Recent Good System (RGS) value using the expanded search window.

27. The computer program product of claim 26, wherein determining the at least one fresh calibration parameter is based on the at least one RGS value.

28. The computer program product of claim 25, wherein determining that the at least one calibration parameter is not suitable for use in the at least one calibration technique is based on at least one quality metric value.

29. The computer program product of claim 25, wherein the instructions further cause the processor to:
determine whether a field calibration parameter is older than a threshold age.

30. The computer program product of claim 29, wherein the instructions further cause the processor to:
determine whether a wireless wide area network (WWAN) calibration parameter is older than a threshold age.

31. The computer program product of claim 30, wherein the instructions further cause the processor to:
determine whether a global positioning system (GPS) calibration parameter is older than a threshold age.

32. The computer program product of claim 25, wherein determining the at least one fresh calibration parameter is based on the following equation:

$$C_0\_Fresh = RGS - FT\ curve\ estimate + C_0,$$

wherein $C_0\_Fresh$ is the at least one fresh calibration parameter, RGS is a Recent Good System value, FT curve estimate is a calibration curve and $C_0$ is a constant.

* * * * *